United States Patent [19]
Yamamoto

[11] Patent Number: 5,204,989
[45] Date of Patent: Apr. 20, 1993

[54] CHARGE SENSING DEVICE

[75] Inventor: Junichi Yamamoto, Tokyo, Japan

[73] Assignee: NEC Corporation, Japan

[21] Appl. No.: 698,555

[22] Filed: May 10, 1991

[30] Foreign Application Priority Data

May 14, 1990 [JP] Japan .................................. 2-123693

[51] Int. Cl.$^5$ ...................... H01L 29/78; H01L 27/02
[52] U.S. Cl. ................................ 257/221; 257/239;
257/250; 377/60; 377/63
[58] Field of Search .................. 377/60, 63; 357/24 M,
357/24

[56] References Cited

U.S. PATENT DOCUMENTS 4,603,426 7/1986 Sauer ................................ 357/24 M
4,878,103 10/1989 Cazaux et al. ..................... 357/24 M

FOREIGN PATENT DOCUMENTS 0192142 8/1986 European Pat. Off. ......... 357/24 M
59-11680 1/1984 Japan ................................ 357/24 M Primary Examiner—Andrew J. James
Assistant Examiner—Ngan Van Ngo
Attorney, Agent, or Firm—Laff, Whitesel, Conte & Saret

[57] ABSTRACT

In a charge transfer device, a low impurity density region is provided in its portion forming a floating capacitor. It becomes possible thereby to reduce the capacitance of the floating capacitor and thus to ensure a larger output voltage relative to a signal charge.

2 Claims, 2 Drawing Sheets

CHARGE SENSING DEVICE

BACKGROUND OF THE INVENTION

1. Field of the Invention

The present invention relates to a charge transfer device, particularly to a charge transfer device for converting a signal electric charge to a signal electric potential by means of a floating capacitor.

2. Description of the Prior Art

A prior art charge transfer device is illustrated in FIG. 1 by way of a longitudinal section. This device is an example of a buried channel type two-phase driven type device and is constituted by a p-type silicon substrate 1, an n-type impurity layer 2 formed thereon, first layer charge transfer electrodes 4a, 4b and 4c consisting of polycrystal silicon, second layer charge transfer electrodes 5a and 5b consisting of polycrystal silicon, an insulating film 3 formed between the silicon substrate and the first and the second layer charge transfer electrodes and also between the first layer charge transfer electrodes and the second layer charge transfer electrodes, $n^{--}$-type impurity regions 6 formed in surface regions of the n-type impurity layer 2, an output gate 7, a floating capacitor 8 for converting a transferred signal charge to a potential variation, a reset gate 9, an $n^+$-type impurity region 10 formed in a surface region of the n-type impurity layer 2 and an output transistor 11 for detecting the potential variation in the floating capacitor 8.

The first layer charge transfer electrodes 4a, 4b and so on are coupled with the left side neighboring second layer charge transfer electrodes 5a, 5b and so on, and to these couples, transfer clock signals $\phi_1$ and $\phi_2$ of reverse phases to each other are applied alternately. Further, a fixed output gate 7, a rest pulse $\phi_R$ is applied to the reset gate 9 and a source voltage $V_2$ is applied to the $n^+$-type impurity region 10 and a drain terminal of the output transistor 11.

Next, operation of the prior art device shown in FIG. 1 will be explained with reference to a potential graphs illustrated in FIG. 2.

When the rest pulse $\phi_R$ goes to a high level, a potential of a portion of the n-type impurity layer 2 located between the output gate 7 and the reset gate 9 is set at the source voltage $V_2$. Then, when the reset pulse $\phi_R$ goes to a low level, said portion of the n-type impurity layer 2, which forms one of the electrodes of the floating capacitor 8, is electrically isolated from other portions. At this time, the transfer clock signal $\phi_1$ and $\phi_2$ are set at a high level and a low level, respectively and thus signal charge is stored under the first layer charge transfer electrodes 4a, 4c and so on to which the transfer clock signal $\phi_1$ is applied [FIG. 2(a)]. Next, when the transfer clock signals $\phi_1$ and $\phi_2$ go to a low level and a high level, respectively, the signal charge stored under the charge transfer electrodes to which the trnsfer clock signal $\phi_1$ is applied is transferred to portions under right-side neighboring charge transfer electrodes to which the transfer clock signal $\phi_2$ is applied. At this time, the signal charge stored under the final charge transfer electrode 4a flows into the floating capacitor 8 through a channel under the output gate 7 [FIG. 2(b)].

When the transferred signal charge quantity is represented by Q and the capacitance of the floating capacitor is represented by C, potential variation amount $\Delta V$ of the floating capacitor 8 can be represented as follows:

$$\Delta V = Q/C$$

This potential variation amount $\Delta V$ is taken out through the output transistor 11.

In such a prior art charge transfer device, however, the output voltage value corresponding to the signal charge quantity is decided by the capacitance of the floating capacitor. Therefore, the level of the output voltage corresponding to a fixed signal charge quantity is elevated as the capacitance of the floating diffusion layer is made smaller. For this reason, in order to raise the sensitivity of the charge transfer device, it has been usually employed to reduce the surface area of the floating capacitor, that is, to narrow the distance between the output gate 7 and the reset gate 9 thereby to narrow the distance between channel stoppers existent at both ends of the n-type impurity layer 2. In these days, however, reduction of the capacitance by such means has been achieved to an almost maximum extent and so there is a demand for new means for capacitance reduction in place thereof.

SUMMARY OF THE INVENTION

An object of the present invention therefore is to realize a charge transfer device having new means for reducing capacitance of its floating capacitor.

The present invention thus provides a charge transfer device comprising:

(a) a semiconductor material region of one conductivity type, (b) plural charge transfer electrodes formed on the semiconductor material region with an interposed insulating film, (c) an output gate formed on the semiconductor material region with an interposed insulating film, adjacent to a terminal one of the charge transfer electrodes, (d) a reset gate formed on the semiconductor material region with an interposed insulating film, at a predetermined distance apart from the output gate, (e) a low impurity density region of one conductivity type formed in the semiconductor material region between the output gate and the reset gate, and (f) a high impurity density region of one conductivity type formed in the semiconductor material region at a side opposite to the low impurity density region relative to the reset gate.

The above charge transfer device may be formed on a silicon substrate for example of a p-type having an impurity density of $2 \times 10^{15}/cm^3$.

The semiconductor material that forms the region (a) may be of an n-type impurity layer having an impurity density for example of $4 \times 10^{16} - 5 \times 10^{16}/cm^3$, such as $4.5 \times 10^{16}/cm^3$. When the semiconductor material that forms the region (a) is of an n-type impurity layer having an impurity density of $4.5 \times 10^{16}/cm^3$, the low impurity density region (e) and the high impurity density region (f) may be of an $n^{--}$-type impurity layer having an impurity density for example of $1 \times 10^{16} - 2 \times 10^{16}/cm^3$, such as $2 \times 10^{16}/cm^3$ and an $n^+$-type impurity layer having an impurity density for example of $3 \times 10^{20}/cm^3$, respectively.

DESCRIPTION OF THE PREFERRED EMBODIMENTS

The present invention will be explained below further in detail with respect to its embodiment shown in FIG. 3.

Figure 1:
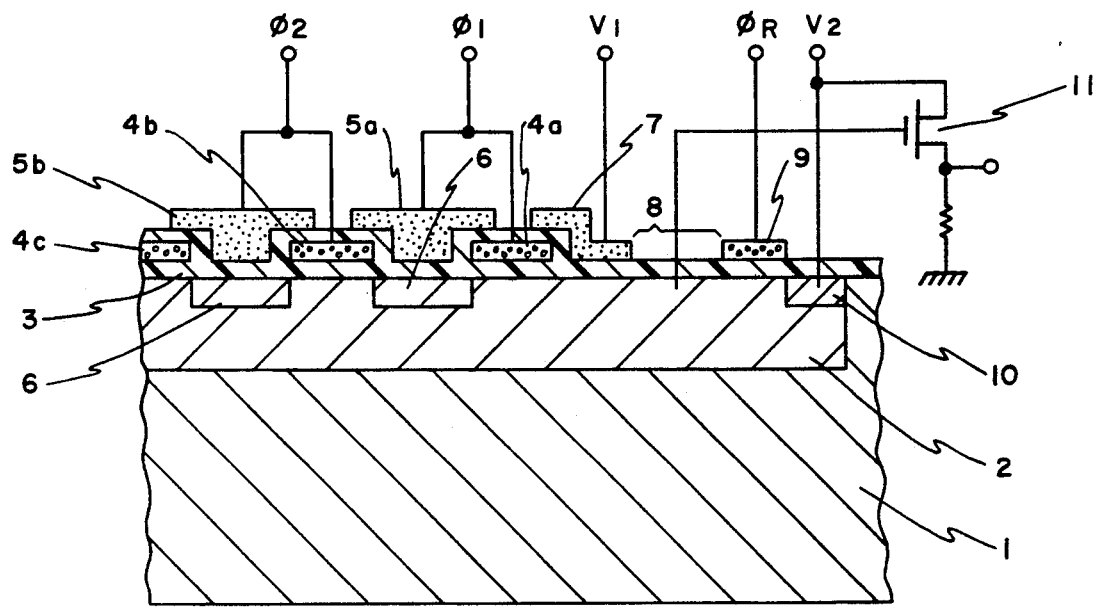
FIG. 1 shows a longitudinal section of a prior art charge transfer device.
Figure 3:
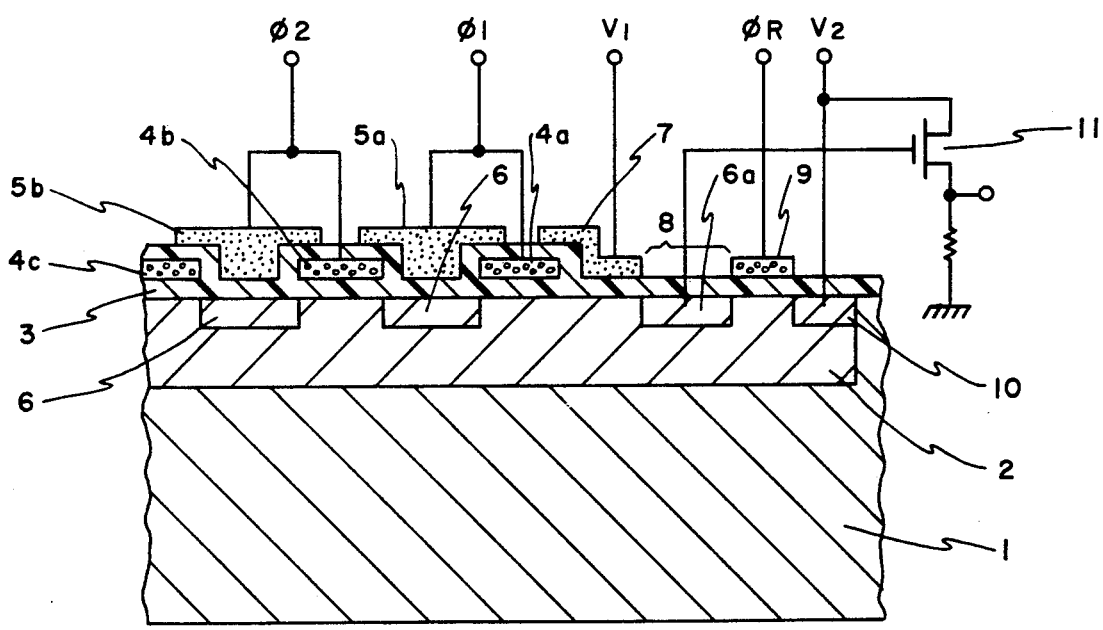
FIG. 3 shows a longitudinal section of an embodiment of the charge transfer device according to the present invention.
Figure 2:
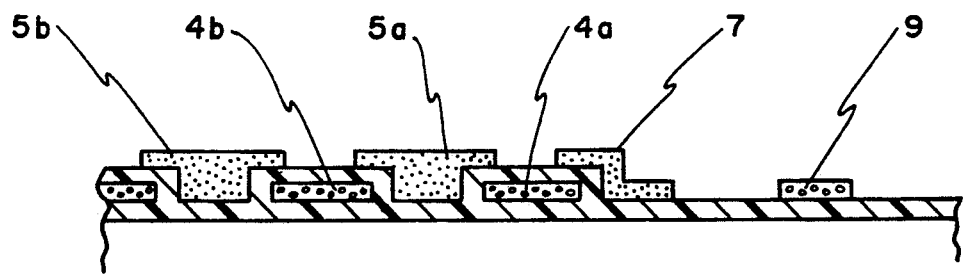
FIG. 2 shows potential graphs relative to the prior art charge transfer device shown in FIG. 1.
Figure 2A:
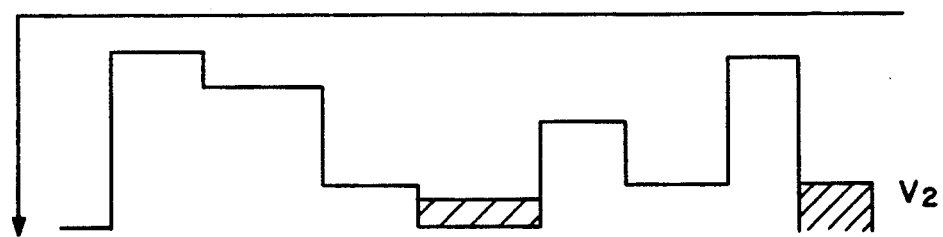
Figure 2B:
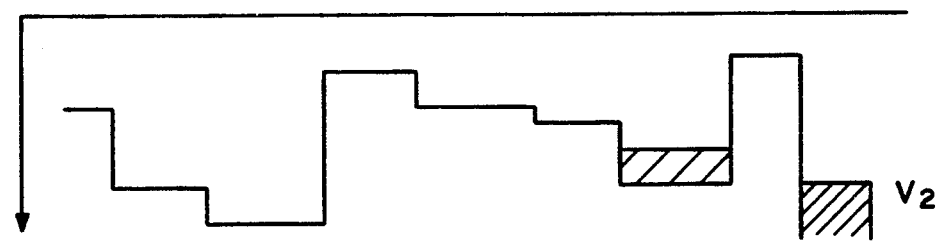

In FIG. 3, a charge transfer device as an embodiment of the present invention is illustrated by way of a longitudinal section and portions identified by reference numbers same as those shown in FIGS. 1 and 2 are portions same as those explained with reference the prior art device shown in FIGS. 1 and 2.

In this embodiment, the p-type silicon substrate 1 may have an impurity density for example of $2 \times 10^{15}/cm^3$, the n-type impurity layer 2 may have an impurity density for example of $4 \times 10^{16}$–$5 \times 10^{16}/cm^3$, such as $4.5 \times 10^{16}/cm^3$. When the impurity density of the n-type impurity layer 2 is $4.5 \times 10^{16}/cm^3$, the n-type impurity regions 6 may have an impurity density for example of $3 \times 10^{16}$–$4 \times 10^{16}/cm^3$. The n+-type impurity region 10 may have an impurity density for example $3 \times 10^{20}/cm^3$.

The device of the present invention shown in FIG. 3 is different from the prior art device shown in FIGS. 1 and 2 in that an n−-type impurity region 6a is formed in the surface region of the n-type impurity layer 2 between the output gate 7 and reset gate 9, in the former device. This region 6a may be formed together with the n−-type impurity regions 6 when the letter is formed by introducing a p-type impurity into the surface region of the n-type impurity layer 2 between the first layer transfer electrodes, after the first layer transfer electrodes 4a, 4b and so on and the reset gate 9 are formed on the silicon substrate.

The operation itself of the device of the present invention shown in FIG. 3 is similar to that of the prior art shown in FIGS. 1 and 2, and so when the signal charge quantity transferred to the floating capacitor 8 is represented by Q and the capacitance of the floating capacitor 8 is represented by C, the potential variation amount $\Delta V$ of the floating capacitor may similarly be represented as follows:

$$\Delta V = Q/C$$

wherein however the capacitance of the floating capacitor in the present invention is made smaller than that in the prior art, owing to the fact that an n−-type impurity region 6a is formed in the portion which forms one of the electrodes of the floating capacitor, according to the present invention.

For example, when the impurity density in the n-type impurity layer 2 is $4.0 \times 10^{16}/cm^3$ and the impurity density in the n−-type impurity region 6a is $3.0 \times 10^{16}/cm^3$, it is possible to reduce the capacitance of the floating capacitor 8 for about 20%.

As explained in detail as above, a low impurity density region is provided in a portion of an n-type impurity layer forming a floating capacitor. It becomes possible thereby to reduce the capacitance of the floating capacitor and thus to ensure a larger output voltage relative to a signal charge.

I claim:

1. A charge transfer device comprising:
   (a) a semiconductor material region of one conductivity type forming a channel of said charge transfer device
   (b) a plurality of charge transfer electrodes formed on the semiconductor material region with an interposed insulating film,
   (c) an output gate formed on the semiconductor material region with an interposed insulating film, adjacent to a terminal one of the charge transfer electrodes,
   (d) a reset gate formed on the semiconductor material region with an interposed insulating film, said reset gate being formed at a predetermined distance apart from the output gate,
   (e) a low impurity density region of one conductivity type formed in the semiconductor material region between the output gate and the reset gate, and
   (f) a high impurity density region of one conductivity type formed in the semiconductor material region at a side opposite to the low impurity density region relative to the reset gate,
   said low impurity density region having an impurity density which is lower than the impurity density of said semiconductor material region and said high impurity density region having an impurity density which is higher than the impurity density of said semiconductor material region.

2. The charge transfer device according to claim 1, which is formed on a p-type silicon substrate and wherein said semiconductor material region is an n-type impurity layer having an impurity density of $4 \times 10^{16}$–$5 \times 10^{16}/cm^3$, said low impurity density region is an n−-type impurity region having an impurity density of $2 \times 10^{16}$–$4 \times 10^{16}/cm^3$ and said high impurity density region is an n-type impurity region having an impurity density of about $3 \times 10^{20}/cm^3$.

* * * * *